United States Patent [19]

Streater

[11] Patent Number: 5,449,535

[45] Date of Patent: Sep. 12, 1995

[54] LIGHT CONTROLLED VAPOR DEPOSITION

[75] Inventor: Alan D. Streater, Bethlehem, Pa.

[73] Assignee: Competitive Technologies, Inc., Bethlehem, Pa.

[21] Appl. No.: 259,199

[22] Filed: Jun. 13, 1994

[51] Int. Cl.$^6$ .............................................. B05D 3/06
[52] U.S. Cl. ................... 427/582; 427/584; 427/250; 427/109; 427/595; 427/596
[58] Field of Search ............... 427/582, 583, 584, 595, 427/596, 250, 109

[56] References Cited

PUBLICATIONS

Kleinfeld et al, "Light-controlled vapor deposition by light-induced drift", Appl. Phys. Lett. 62(24) 1993, p. 3077–3079.

S. N. Atutov and A. M. Shalagin, Opt. Commun. 83, 307, 1991, pp. 3–11.

P. C. Johnson, Plating and Surface Finishing, Jun. 1989, pp. 30–33.

J. Lamier, "Developments in the Deposition of Hard Coatings by Plasma–Based Techniques", Vaccum, vol. 40, No. 1,2, pp. 27–32, 1990.

K. Upadhya and T. C. Tierney, "Plasma Techniques for the Surface modification and Synthesis of Novel Materials", JOM, pp. 6–10, 1989.

D. T. Mugglin and A. D. Streater, "Momentum Transport Cross Sections For Excited and Ground State Potassium With Rare Gases by Light Induced Diffusive Pulling", J. Phys.B. Atom, Molec. and Optical Physics, vol. 26, No. 4 pp. 689–704 (1993).

A. Streater and J. P. Woerdman, "Strong Collision Model for Light–Induced Drift of Multi–Level Atoms", J. Phys. B: At. and Mol. Phys. 22, pp. 677–691 (1989).

F.Kh. Gel'mukhanov and A. M. Shalagin, Pis'ma Zh. Eksp. Teor. Fiz. 29, 773 (1979) [JEPT Lett. 29,711 (1979)].

F.Kh. Gel'mukhanov and A. M. Shalagin, Pis'ma Zh. Eksp. Teor. Fiz. 77,773 (1979) [Sov.Phys. JEPT 50,234 (1979)].

D. T. Mugglin, A. D. Streaker, S. Balle and K. Bergman, "Observation of White Light Induced Separation of Rb Isotopes" Optics Communications, vol. 104, pp. 165–174, Dec. 15, 1993.

A. D. Streater, J. Mooibroek and J. P. Woerdman, "Light–Induced Drift in Rubidium: Spectral Dependence and Isotope Separation", Opt. Commun. 64(2), 137–143 (1987).

Hermans, L. J. F. "Light–induced kinetic effects in molecular gases" International Reviews in Physical Chemistry, 1992, vol. 11. No.2, 289–315.

McGraw–Hill Encyclopedia of Science & Technology, vol. 19 ULC–ZYG, 7th Edition pp. 165–169.

*Primary Examiner*—Roy V. King
*Attorney, Agent, or Firm*—Michael R. Novack

[57] ABSTRACT

A method is disclosed for depositing a substance on a substrate, including the following steps: providing the substrate in a deposition chamber, providing in the chamber a vapor of the substance, providing a buffer gas in the chamber, and directing a light beam at the substrate to control deposition of the substance by causing light induced drift.

7 Claims, 2 Drawing Sheets

LIGHT CONTROLLED VAPOR DEPOSITION

FIELD OF THE INVENTION

This invention relates to a method for depositing materials on substrates and, more specifically to light controlled vapor deposition.

BACKGROUND

Coatings can be deposited on a substrate by techniques that utilize solutions, liquids, vapors, and solids as sources of the deposition materials. Deposition from the vapor phase is commonly associated with the production of a film of material. This production normally takes place on a heated substrate and in a vacuum. However, since it is frequently undesirable to significantly raise the temperature of a substrate, the high temperatures associated with vapor transport make it unsuitable for a number of applications.

Vapor deposition involves three basic steps in the formation of a coating film on a substrate: synthesis or creation of the deposition species, transport of these species from the source to the substrate, and growth of the film on the substrate. These steps can operate independently or interdependently, depending on the particular process. It is preferable to use a process where the steps operate independently, thereby allowing greater flexibility and control.

Chemical vapor deposition (CVD) is a common deposition technique. It offers good quality and excellent uniformity of the deposited film, but requires a relatively high deposition temperature.

In basic thermal chemical vapor deposition process, the reactants flow over a heated substrate surface to deposit a film. Generally the kinetics of the process are dependent on diffusion through the boundary layer between the substrate and the bulk gas-flow region. Temperatures for reactions used in CVD are usually in the range of 500°–1200° C. (930°–2200° F.).

Physical vapor deposition (PVD) is another thin film deposition technique, wherein the material to be deposited is derived from a source by physical means, and then deposited on a substrate.

The two basic processes for physical vapor deposition are: evaporation deposition and sputter deposition. In evaporation, thermal energy converts a solid or target material to the vapor phase. In sputtering, the target is based to a negative potential and bombarded by positive ions of the working gas from the plasma, which knock out the target atoms and convert them to vapor by momentum transfer.

Plasma assisted techniques are, essentially, variants of chemical and physical vapor deposition processes, which rely on the vapor transport of materials to construct new surface. Plasma assisted CVD is similar to thermal CVD with the addition of a radio-frequency biased parallel plate above the substrates. The presence of the plasma activates the deposition reaction. Various compounds are deposited by plasma-assisted chemical vapor deposition (e.g., silicon, carbon, polymers, silicon nitride, iron oxide, silicon carbide). Plasma assisted deposition techniques result in variability in the composition of the deposited species.

In physical vapor deposition, the step of transportation of the species from source to substrate may include the presence of plasma.

Most vapor deposition processes are characterized by relatively high temperature operation, which can be problematic. Plasma assisted deposition can result in undesirable space charge build-up effects. Also, in many applications, precise control of the deposited substrate is lacking with plasma assisted deposition.

It is among the objects of the present invention to provide an improved vapor deposition technique that addresses and solves these and other problems of prior art vapor deposition methods.

SUMMARY

The present invention utilizes light-induced drift (LID) to advantage in a vapor deposition process.

Light-induced drift is a kinetic effect of light based on a velocity-selective excitation and a state-dependent diffusive cross section with other species in a gas mixture. Light-induced drift and light-induced drift was predicted by Gelmukhanov and Shalagin in 1979, and has been subsequently demonstrated and studied through the 1980's.[see e.g. JEPT Lett. 29, 711 (1979), Sov. Phys. JEPT 50, 234 (1979)]]

Light-induced drift occurs when light causes a velocity-selective excitation of atoms in a gas mixture, and when the collisional interactions with other species in the gas mixture are state dependent. LID has the physical effect of causing the atoms of the selected species to drift through the gas mixture. A single mode laser commonly provides the velocity-selective excitation by tuning to one side of the Doppler absorption profile. The drift can be either positive (pushing) or negative (pulling), depending on the detuning of the light from the center of the line. Drift velocities of greater than 20 m/s have been reported in alkali-rare gas vapors. The separation effect results from an entropy exchange between the light and the gas mixture. LID is stronger than light pressure in the sense that for LID, each photon causes a change in momentum on the order of the nuclear momentum through collisions with the buffer gas, while light pressure is a direct exchange of the photon momentum, which is much smaller. Scientific applications of light-induced drift include the measurement of state-dependent diffusive cross-sections for various atoms and molecules with other species, the measurement of state-dependent wall interactions, and more recently the velocity dependence of diffusive cross sections. The cross section measurements can directly be compared with calculated values from theoretical potential curves, and therefore provide a valuable test of these potential curves. It has been suggested that LID might offer an explanation for anomalous abundances in so called peculiar stars and abundances of species in the formation of the solar system.

Although the scientific applications for light-induced kinetic effects have been quite successful, industrial applications have been slow to develop. Nearly all LID experiments have demonstrated possible applications for removing all impurities from gases. Isotope separation of molecular and atomic vapors by LID has been demonstrated. The accumulation and concentration of species by LID can also be used to measure trace abundances. Atutov (Opt. Commun. 83, 307–309 (1991)) has demonstrated density enhancements of $10^3$, and much greater enhancements are possible.

One important quality of LID is the ability to control the bulk motion of the atoms easily with externally applied light beams.

Applicant provides a method for depositing a material on a substrate surface utilizing LID by selectively pulling the atoms of a material through a buffer gas and onto a target substrate surface. Applicant also provides a method whereby LID is used to push atoms away from selected areas on a substrate surface. This results in ordinary diffusive deposition in areas of no light, with no deposition where the field is present.

A primary benefit of applicant's method is the ability to draw or push a vapor through a cold buffer gas, allowing a gentle low temperature coating on sensitive surfaces. Additionally, the deposited atoms are electrically neutral, eliminating space charge buildup effects associated with plasma deposition.

An important feature of applicant's deposition technique is that the deposition can be controlled by light. Layers can be "written" onto the surface by controlling the position, frequency, and intensity of the laser beam. The LID process is also species and isotopive selective. It is envisioned that several species in a vapor could be deposited in succession from a single mixture. Additionally, the species selectivity could also be employed to push away unwanted impurities from an industrial process. An example might be to force a reactive species such as neutral fluorine onto a surface for etching in semiconductor productions.

Applicant's LID vapor deposition is diffusive in nature, eliminating shadowing effects that occur in direct vacuum deposition. Additionally, Applicant's method results in uniform deposition over convoluted surfaces, and for making good electrical contact between the film and metal terminal strips.

Further features and advantages of the invention will become more readily apparent from the following detailed description when taken in conjunction with the accompanying drawings

DETAILED DESCRIPTION

Figure 1:
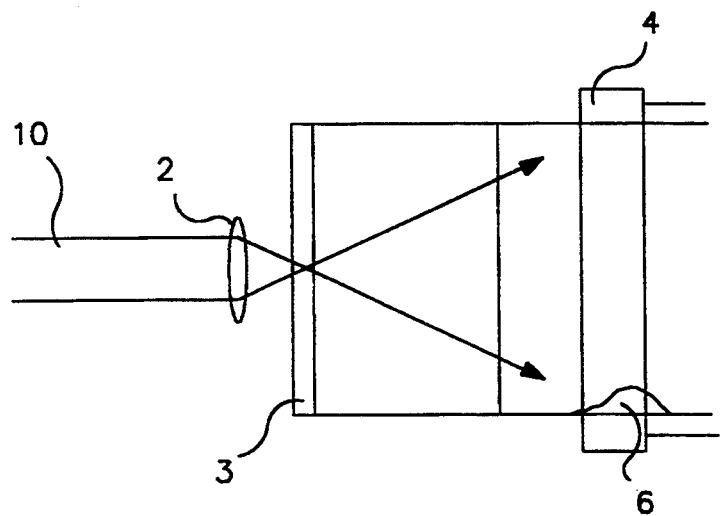
FIG. 1 is a schematic diagram of an apparatus that can be used in practicing an embodiment of the invention.

An embodiment of Applicant's invention is illustrated in conjunction with FIG. 1, which shows a diagram for vapor deposition in a chamber (not shown) containing a buffer gas, such as argon, at controlled pressure. In this particular embodiment, light is emitted from a single-mode Ti: sapphire cw ring laser (not shown), detuned 0.5 GHz to blue from the fluorescence maximum of potassium $D_1$ resonance at 769.9 nm. The lens 2 is a 25 mm focal length convex lens placed so that it is just inside the glass window 3. The container is a borosilicalite glass tube containing a few mg of potassium and wrapped with heat tape 4. At 150° C., the estimated potassium number density under the heat tape is $10^{13}$ $cm^3$. As the layer is detuned from resonance, target atoms are drawn by LID from the heated region in the direction opposite to the light propagation. The atoms drift through the buffer (cooling to the local buffer gas temperature in the process) until they are deposited on the glass substrate 3.

The potassium film thickness is determined from transmission measurements of collimated, incandescent light which has been passed through $\lambda_0 = 760$ nm narrow bandpass. Incoherent light is preferred over laser light for this purpose of measurement, to minimize undesirable interference effects.

Figure 3:
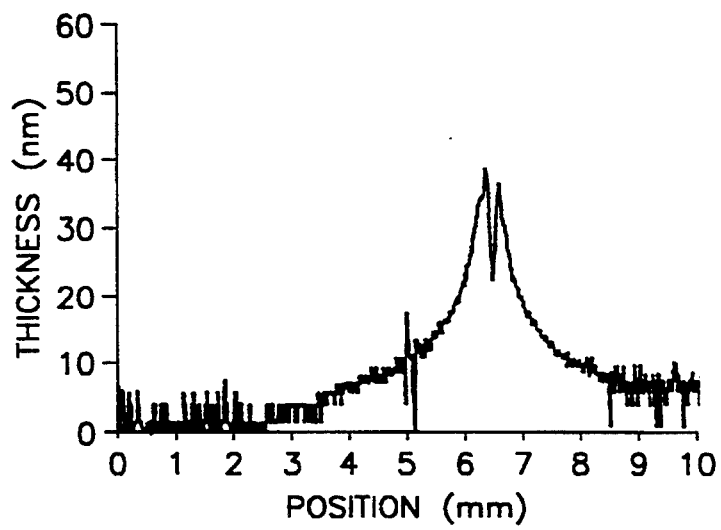
FIG. 3 is a graph depicting thickness of deposited film vs. horizontal position after 15 min. exposure where the buffer gas pressure is 50 Torr (Ar).
Figure 4:
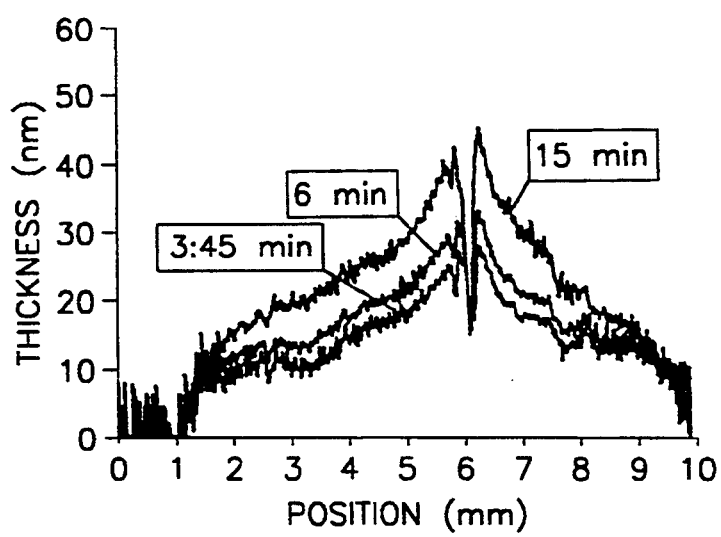
FIG. 4 is a graph depicting thickness of deposited film vs. horizontal position after three time exposures where the buffer gas pressure is 50 Torr (Ar).

FIGS. 3 and 4 illustrate the results of two pulling experiments at different buffer gas pressures. FIG. 3 shows a cross section layer deposited after 15 minutes with 50 Torr argon, while FIG. 4 shows the development of a layer deposited with 5 Torr argon. In both instances the focused spot was much less than 1 mm in diameter at the substrate and the effect of diffusive "feathering" out from the laser spot is clearly visible. FIGS. 3 and 4 demonstrate an increased resolution with higher buffer gas pressures. This is expected because the reduced mean free path slows the diffusion of potassium atoms out of the laser beam. The drift slows as well due to a decrease in the velocity selectivity of the excitation. The resolution, however, depends on the relative strength of the LID transport compared to the diffusive transport, and increases at higher pressure. As the buffer gas pressure is lowered, the volume of potassium delivered to the substrate is much larger. This is achieved, however, at the expense of spatial resolution. There is also a point which the pressure is so low that regular diffusion contributes substantially to film growth and spatial resolution is essentially lost. In experiments with potassium in argon, this occurred at roughly 1 Torr. One obvious problem with this pulling method of deposition is that the light controlling the process must pass through an absorbing layer of the chemical which it has just helped to deposit. This can lead to heating and burn off at the focal point of the laser light, and general slowing of the deposition rate. This is the central dip observed in FIGS. 3 and 4. The burned hole can be eliminated by focusing further behind the surface and/or actively cooling the substrate cool air can be blown on the substrate to keep it at room temperature.

It is important to impart to the target atoms a velocity component directed towards the center line of the light cone by wave-front curvature in order to collect the atoms into a high density region before they are deposited onto the substrate. This was demonstrated by replacing the 25 mm FL lens with a 270 mm FL lens and observing that no film deposit whatsoever with 50 Torr argon after 15 min. The wave front curvature could also improve the resolution by countering diffusion out of the beam near the substrate.

Figure 2:
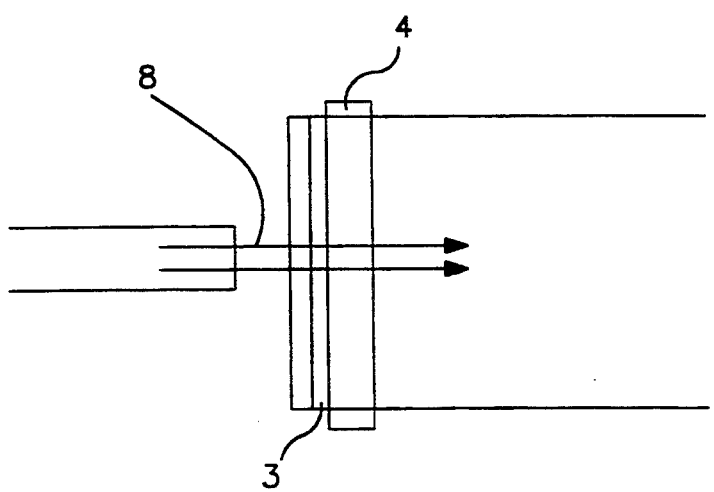
FIG. 2 is another diagram of an apparatus that can be used in practicing an embodiment of the invention.

The use of light induced drift to prevent vapor deposition of target atoms onto a substrate in designated areas is shown in FIG. 2. The lens 4 is placed all the way up to the window 3, and a mask (not shown) is placed over the window with a cut-out rectangle area of 6.8 $mm_2$. The collimated beam 8 fills the square beam with sharp edges enters the vapor. The laser is then detuned from resonance to push the target atoms way from the window, so that as the cell is heated, potassium atoms will vapor deposit everywhere except where they interact with light. Using a 1 torr argon and 320 mW total laser power resulted in an area slightly larger than the square remaining clear of the deposited film. Subsequent experiments revealed that a balance between buffer gas pressure and laser intensity is required to maximize the spatial resolution of the image, and a sharp square was obtained with 1 Torr Argon and 35 MW total power after the masks. The edge resolution of the coated square was 100 µm.

The invention has been described with reference to particular preferred embodiments, but variation within the spirit and the scope of the invention will occur to those skilled in the art. For example, while a single light beam was illustrated for implementing LID, it will be understood that more than one beam can be utilized. The beams can be controlled independently or together. Further an interference pattern or hologram could be established on a surface or surfaces where deposition is to be controlled.

I claim:

1. A method for depositing a substance on a substrate, comprising the steps of:
    (a) providing said substrate in a deposition chamber;
    (b) providing in said chamber a vapor of said substance;
    (c) providing a buffer gas in said chamber; and
    (d) directing a light beam at said substrate to control deposition of said substance by causing light induced drift.

2. The method as defined by claim 1 wherein the substance is an atomic species.

3. The method as defined by claim 1 wherein the buffer gas is an inert gas.

4. The method as defined by claim 3 wherein the inert gas is argon.

5. The method as defined by claim 1 wherein the step of directing the light beam comprises directing said light beam toward a region on said substrate to move said substrate away from said region.

6. The method as defined by claim 1 wherein said substance is a metal.

7. The method as defined by claim 5 wherein said substance is a metal.

* * * * *